United States Patent
Koga et al.

(10) Patent No.: US 7,613,033 B2
(45) Date of Patent: Nov. 3, 2009

(54) MAGNETIC STORAGE DEVICE

(75) Inventors: Keiji Koga, Tokyo (JP); Katsumichi Tagami, Tokyo (JP); Tohru Oiakawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/881,305

(22) Filed: Jul. 26, 2007

(65) Prior Publication Data

US 2009/0027949 A1    Jan. 29, 2009

(30) Foreign Application Priority Data

Jul. 26, 2006    (JP)    ............... 2006-203456

(51) Int. Cl.
*G11C 11/00*    (2006.01)
(52) U.S. Cl. ............... 365/158; 365/148; 365/171; 365/173; 365/57
(58) Field of Classification Search ............... 365/158, 365/171, 173, 80–89, 97, 100, 130, 148; 257/421, E21.665; 438/3; 977/933, 934, 977/935
See application file for complete search history.

(56) References Cited

U.S. PATENT DOCUMENTS

| 6,559,511 B1 * | 5/2003 | Rizzo ............... 257/421 |
| 2004/0021189 A1 * | 2/2004 | Yoda et al. ............... 257/421 |

FOREIGN PATENT DOCUMENTS

| JP | 3466470 B | 10/1999 |
| JP | 2000-90658 A | 3/2000 |
| JP | 2004-128430 A | 4/2004 |

* cited by examiner

*Primary Examiner*—Son Dinh
*Assistant Examiner*—Harry W Byrne
(74) *Attorney, Agent, or Firm*—Porzio, Bromberg & Newman, P.C.

(57) ABSTRACT

A magnetic storage device is provided which has significantly reduced power consumption. In the magnetic storage device, a yoke is arranged so as to circumferentially surround part of a line extending in an arbitrary direction, and a magnetoresistive element to which information can be written by utilizing a magnetic field generated by the line is arranged in the vicinity of the line. In this case, the length of the magnetic path of the yoke is set to 6 μm or less.

20 Claims, 13 Drawing Sheets

MAGNETIC STORAGE DEVICE

BACKGROUND OF THE INVENTION

1. Field of the Invention

The present invention relates to a magnetic storage device for storing information in magneto-resistive elements.

2. Description of the Related Art

In recent years, MRAM (Magnetic Random Access Memory) has been receiving attention as a storage device for use in information processing devices such as computers and communication devices. With MRAM, data is stored magnetically, and the direction of magnetization can be maintained without using any electrical means. Volatile memory such as DRAM (Dynamic Random Access Memory) and SRAM (Static RAM) has the disadvantage that information is lost when power failure occurs. However, such a disadvantage can be avoided with MRAM. Furthermore, when compared with conventional non-volatile storage means such as flash EEPROM and hard disk devices, MRAM is superior in terms of access speed, reliability, power consumption, and the like. Therefore, it is believed that MRAM has functions which can replace all the functions of volatile memories such as DRAM and SRAM and of nonvolatile storage means such as flash EEPROM and hard disk devices (see the publication of Japanese Patent No. 3466470).

For example, in the development of information devices with the aim of realizing so-called ubiquitous computing which enables information processing at any location, storage devices are required which are adaptable to high-speed processing while power consumption is reduced, and in which loss of information can be avoided even when power failure occurs. MRAM has the potential to meet all these requirements simultaneously and is expected to be employed in a variety of information devices in the future.

In particular, sufficient power supply cannot always be provided in tablets, portable information terminals, and the like which are intended to be carried on a daily basis. Therefore, in order to carry out a large amount of information processing in severe use environments, a further reduction in power consumption during information processing is required even for MRAM, for which low power consumption is expected.

As examples of the technologies intended to further reduce power consumption in MRAM, Japanese Patent Application Laid-Open Nos. 2000-90658 and 2004-128430, for example, disclose magnetic storage devices. Each of these magnetic storage devices comprises: bit lines; word lines arranged orthogonal to the bit lines; tunneling magneto-resistive (TMR) elements; and the like. Each of the TMR elements is provided for each storage area (memory cell) and is arranged at the intersection of the corresponding bit line and the corresponding word line so as to be placed between the intersecting bit and word lines. Furthermore, in these magnetic storage devices, a yoke (being a magnetic field control layer) is arranged around each TMR element between the bit and word lines so as to surround these lines. The yoke is made of a high permeability ferromagnetic material, and functions to reduce the occurrence of magnetic flux leakage from the bit line or the word line and to concentrate the magnetic flux into the TMR element. Therefore, a magnetic field required for inverting the magnetization of the TMR element can be obtained even with low power consumption. Moreover, the magnetic flux can be concentrated into the TMR element.

In this instance, a TMR element includes: a first magnetic layer (being a magnetic sensing layer) in which the direction of magnetization is changed according to an external magnetic field; a second magnetic layer in which the direction of magnetization is fixed; and a non-magnetic insulating layer sandwiched between the first magnetic layer and the second magnetic layer. Binary data is stored in the TMR element by controlling the direction of magnetization of the first magnetic layer so as to be parallel or anti parallel to the direction of magnetization of the second magnetic layer.

However, in the TMR elements used in such magnetic storage devices, the influence of the diamagnetic fields generated there inside increases as the size thereof decreases, and thus the strength of the magnetic field for writing must be increased. Therefore, a contradiction arises in that write currents value be increased when the degree of integration of a magnetic storage device is increased. Consequently, it is generally considered that it is difficult to reduce the size of magnetic storage devices and to increase the recording density thereof.

Furthermore, the increase of write currents results in an increase in the size of transistors for controlling the conduction of the current. Therefore, a problem exists in that the degree of integration cannot be increased.

SUMMARY OF THE INVENTION

The present invention has been developed in view of the foregoing problems, and it is an object of the present invention to show that significant size reduction can be achieved even in magnetic storage devices and to achieve a reduction in power consumption.

The inventors have made intensive studies, and consequently found experimentally that a current value can be reduced by employing a yoke structure in a magnetic storage device and controlling the length of the magnetic path of the yoke.

To achieve the aforementioned object, a first aspect of the present invention is a magnetic storage device comprising: a line; a yoke which circumferentially surrounds part of the line in a longitudinal direction; and a magneto-resistive element which is arranged in the vicinity of the line and to which information can be written by utilizing a magnetic field generated by the line, wherein a length of a magnetic path of the yoke is equal to or less than 6 μm.

To achieve the aforementioned object, a second aspect of the present invention is the magnetic storage device according to the aforementioned aspect, wherein the length of the magnetic path of the yoke is equal to or less than 4 μm.

To achieve the aforementioned object, a third aspect of the present invention is the magnetic storage device according to the aforementioned aspects, wherein the permeability of the yoke is equal to or greater than 300 H/m.

To achieve the aforementioned object, a fourth aspect of the present invention is the magnetic storage device according to the aforementioned aspects, wherein: a gap is formed in part of the yoke in a circumferential direction; and the magneto-resistive element is arranged in or between the gap.

To achieve the aforementioned object, a fifth aspect of the present invention is the magnetic storage device according to the aforementioned aspects, wherein the distance between each of end portions of the yoke forming the gap and the magneto-resistive element contained in the gap defined by the end portions of the yoke is equal to or less than 30 nm.

To achieve the aforementioned object, a sixth aspect of the present invention is the magnetic storage device according to the aforementioned aspects, wherein: a plurality of storage cells each including the line, the yoke, and the magneto-resistive element are arranged in an array; and each of the storage cells comprises write switching means for controlling electrical conduction of the line.

To achieve the aforementioned object, a seventh aspect of the present invention is the magnetic storage device according to the aforementioned aspects, wherein each of the storage cells further comprises: a read line for allowing a current to pass through the magneto-resistive element; and read switching means for controlling electrical conduction of the read line.

According to the present invention, the following advantageous effects can be obtained: A write current can be significantly reduced. Furthermore, variation in write currents between the magnetic storage devices can be reduced during mass production. Also, a write margin can be increased. In addition to these, since the size of peripheral components for controlling a current can be reduced, the magnetic storage device can be made small.

DETAILED DESCRIPTION OF THE PREFERRED EMBODIMENTS

Figure 1:
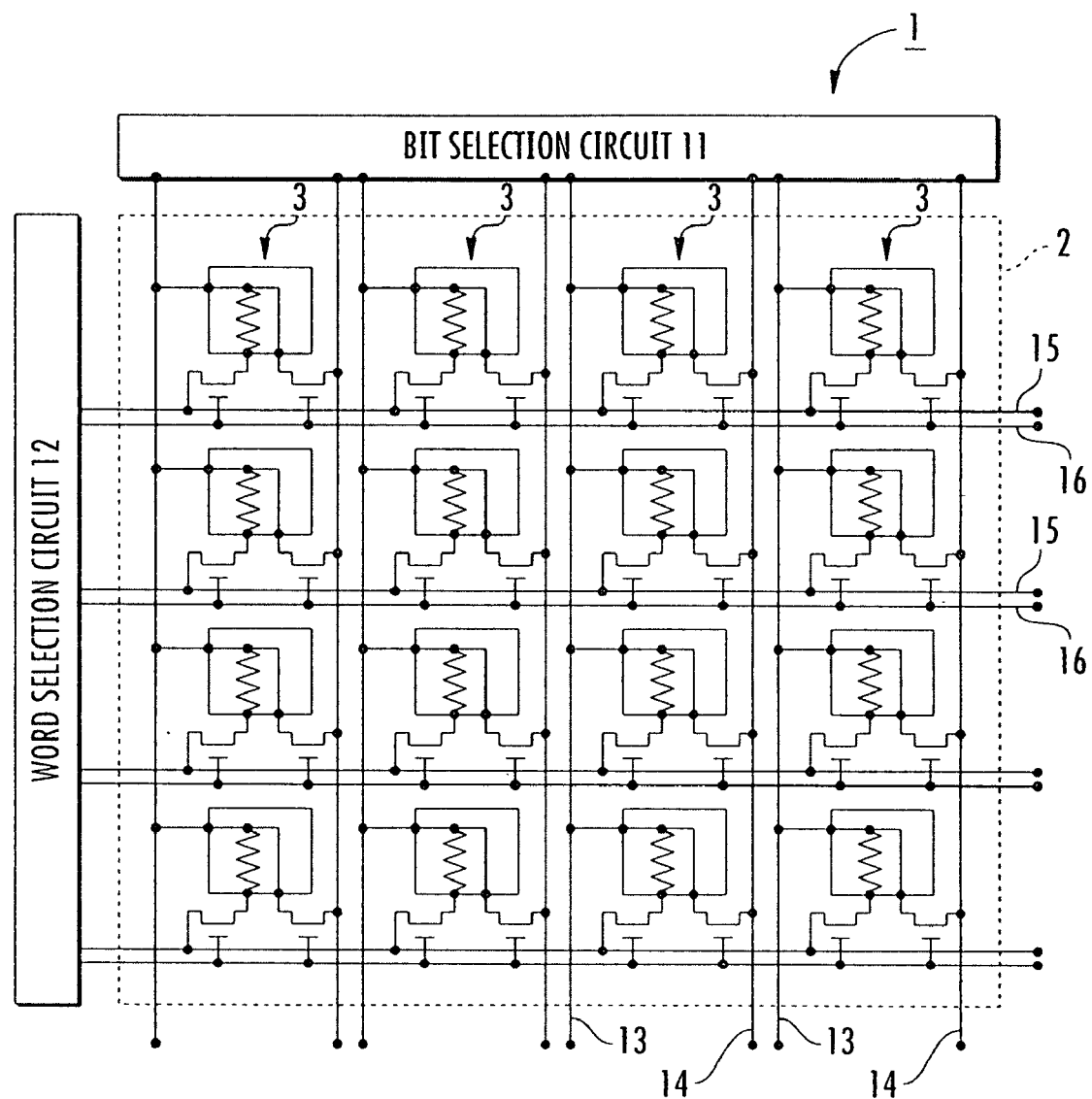
FIG. 1 is a conceptual diagram showing the overall configuration of a magnetic storage device according to an embodiment of the present invention.

Hereinafter, embodiments will be described in detail. It should be appreciated that, throughout the drawings, the same components will be designated with identical reference numerals, and redundant description will be omitted.

Figure 2:
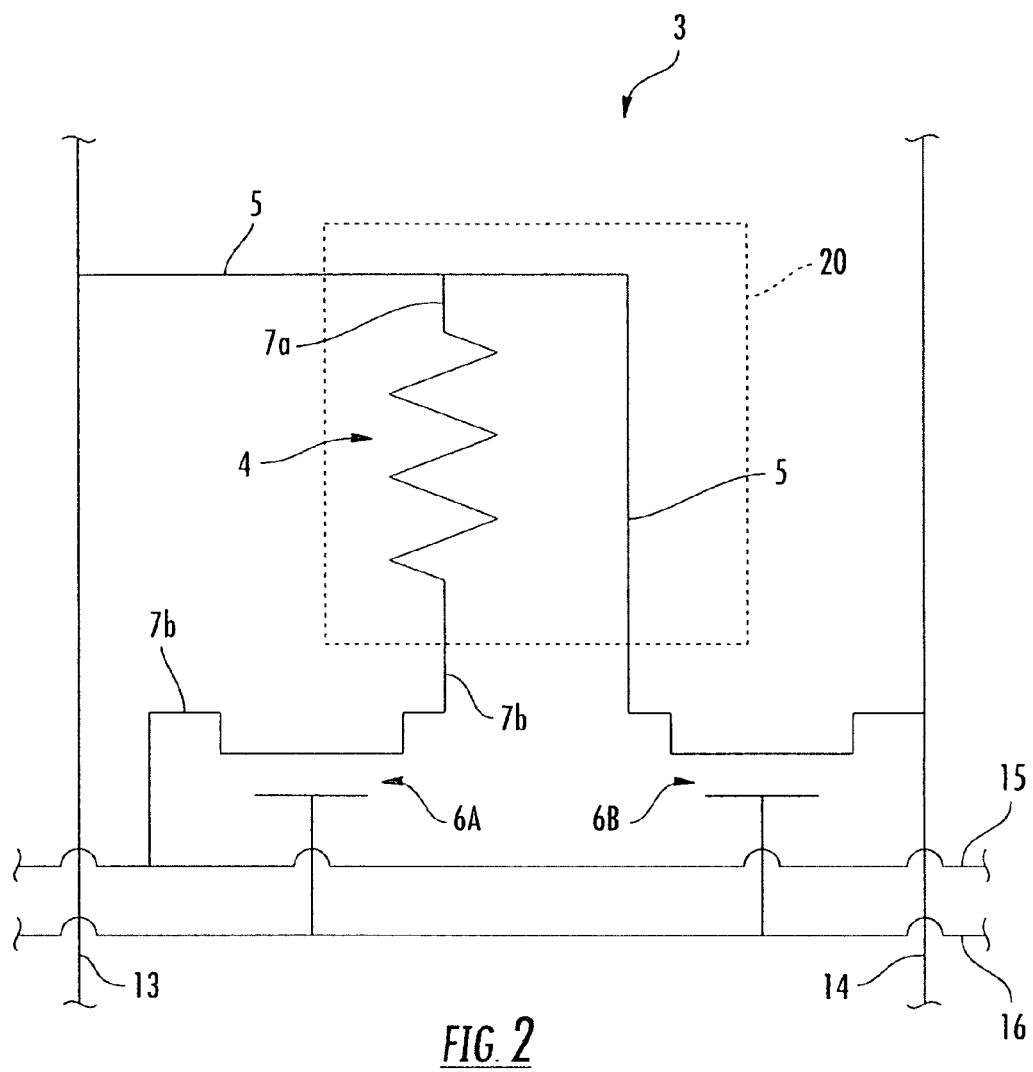
FIG. 2 is an enlarged conceptual diagram showing a storage area of the magnetic storage device.

FIG. 1 is a conceptual diagram showing the overall configuration of a magnetic storage device 1 according to the embodiment of the present invention. The magnetic storage device 1 includes a storage unit 2, a bit selection circuit 11, a word selection circuit 12, bit lines 13 and 14, and word lines 15 and 16. The storage unit 2 has a plurality of storage areas 3 which are arranged in a two-dimensional array with m rows and n columns (m and n are each an integer of 2 or more). As shown in an enlarged view of FIG. 2, each of the storage areas 3 has a TMR element 4, a write line 5, a read transistor 6A, a write transistor 6B, read lines 7a and 7b, a ferromagnetic yoke 20, and the like. It should be appreciated that, since the write line 5 is provided so as to be drawn from one of the bit lines 13, the write line 5, the ferromagnetic yoke 20, and the like are provided independently for each of the storage areas 3. Furthermore, in the present embodiment, the read lines 7a and 7b are provided so as to be branched off from the write line 5, and the TMR element 4 intervenes between the read line 7a and the read line 7b.

The TMR (magneto-resistive) element 4 has a function that, when the direction of magnetization is changed, its own resistance value changes based on a change in the direction of magnetization. Binary data based on the different states of the resistance value is written to the TMR element 4. An external magnetic field for changing the direction of magnetization of the TMR element 4 is generated by the write line 5.

The write line 5 is drawn from one of the bit lines 13, and the other end of the write line 5 is electrically connected to the corresponding bit line 14. The write transistor 6B is switching means for controlling the conduction of a write current in the write line 5, and the drain and source thereof are provided at some midpoint of the write line 5. The gate is connected to one of the word lines 16. Consequently, the write transistor 6B can be brought into a conduction state by passing a current through the word line 16.

One end of the read line 7a is connected to the TMR element 4, and the other end thereof is connected to the write line 5 (or the bit line 13). Furthermore, one end of the read line 7b is connected to the TMR element 4, and the other end thereof is connected to the word line 15. The read transistor 6A is switching means for controlling the conduction of a read current in the read lines 7a and 7b, and the drain and source thereof are provided at some midpoint of the read line 7b. The gate is connected to the word line 16. Consequently, the read transistor 6A can be brought into a conduction state by passing a current through the word line 16.

The bit line 13 and the bit line 14 are provided for each of the columns in the array of the plurality of storage areas 3. Each of the bit lines 13 is connected to the write lines 5 of all the storage areas 3 included in the corresponding column. Similarly, each of the bit lines 14 is connected to the write lines 5 of all the storage areas 3 included in the corresponding column. Consequently, a write current is allowed to pass through a certain write line 5 when the conduction thereof is permitted by means of the write transistor 6B while a potential difference is applied to between the corresponding paired bit lines 13 and 14.

The word line 15 and the word line 16 are provided for each of the rows in the array of storage areas 3. Each of the word lines 16 is connected to the gates of the read transistors 6A and the write transistors 6B of all the storage areas 3 included in the corresponding row. Consequently, each of the word lines 16 serves as a line for permitting the conduction of both the transistors 6A and 6B. Furthermore, each of the word lines 15 is connected to the read lines 7b of all the storage areas 3 included in the corresponding row. Consequently, a read current is allowed to pass through certain read lines 7a and 7b when the conduction thereof is permitted by means of the read transistor 6A while a potential difference is applied to between the corresponding bit line 13 and the corresponding word line 15 forming a pair.

Returning to FIG. 1, the bit selection circuit 11 has a function of providing a positive or negative write current to the write line 5 of each of the storage areas 3. Specifically, the bit selection circuit 11 includes: an address decode circuit for selecting a predetermined column from the array of storage areas 3 in accordance with an address designated internally or externally; and a current drive circuit for applying a positive or negative potential difference to between the paired bit lines 13 and 14 corresponding to this selected predetermined column to supply a write current to the write lines 5 that are provided between the bit lines 13 and 14 in this selected column.

The word selection circuit 12 includes: an address decode circuit for selecting a predetermined row from the array of storage areas 3 in accordance with an address designated internally or externally; and a current drive circuit for applying a predetermined voltage to the word lines 15 and 16 corresponding to this selected row. Therefore, by applying a control voltage to the word line 16 corresponding to the selected row by means of the word selection circuit 12, the read transistor 6A and the write transistor 6B can be brought into a conduction state.

During a write operation, a positive or negative potential difference is applied to between the bit lines 13 and 14 of the address selected by the bit selection circuit 11, and the write transistor 6B of the address selected by the word selection circuit 12 is turned on. Consequently, a write current is allowed to pass only through a storage area 3 at which the addressed bit line intersects the addressed word line. It should be noted that, during the write operation, a current is prevented from passing through the read lines 7 by setting the potential difference between the bit line 13 and the word line 15 to zero.

During a read operation, a column corresponding to the address designated internally or externally is selected by the address decode circuit in the bit selection circuit 11, and a predetermined voltage is applied to the bit line 13 corresponding to the selected column. At the same time, a row corresponding to an address is selected by the address decode circuit in the word selection circuit 12, and a predetermined voltage is applied to the word line 15 corresponding to the selected row to allow a read current to pass between the bit line 13 and the word line 15. Furthermore, a potential difference is produced between the ends of the corresponding word line 16 to turn the read transistor 6A on. Consequently, a read current is allowed to pass only through a storage area 3 at which the addressed bit line intersects the addressed word line. It should be noted that, during the read operation, the passage of a write current is prevented by setting the potential difference between the bit lines 13 and 14 to zero.

Figure 3:
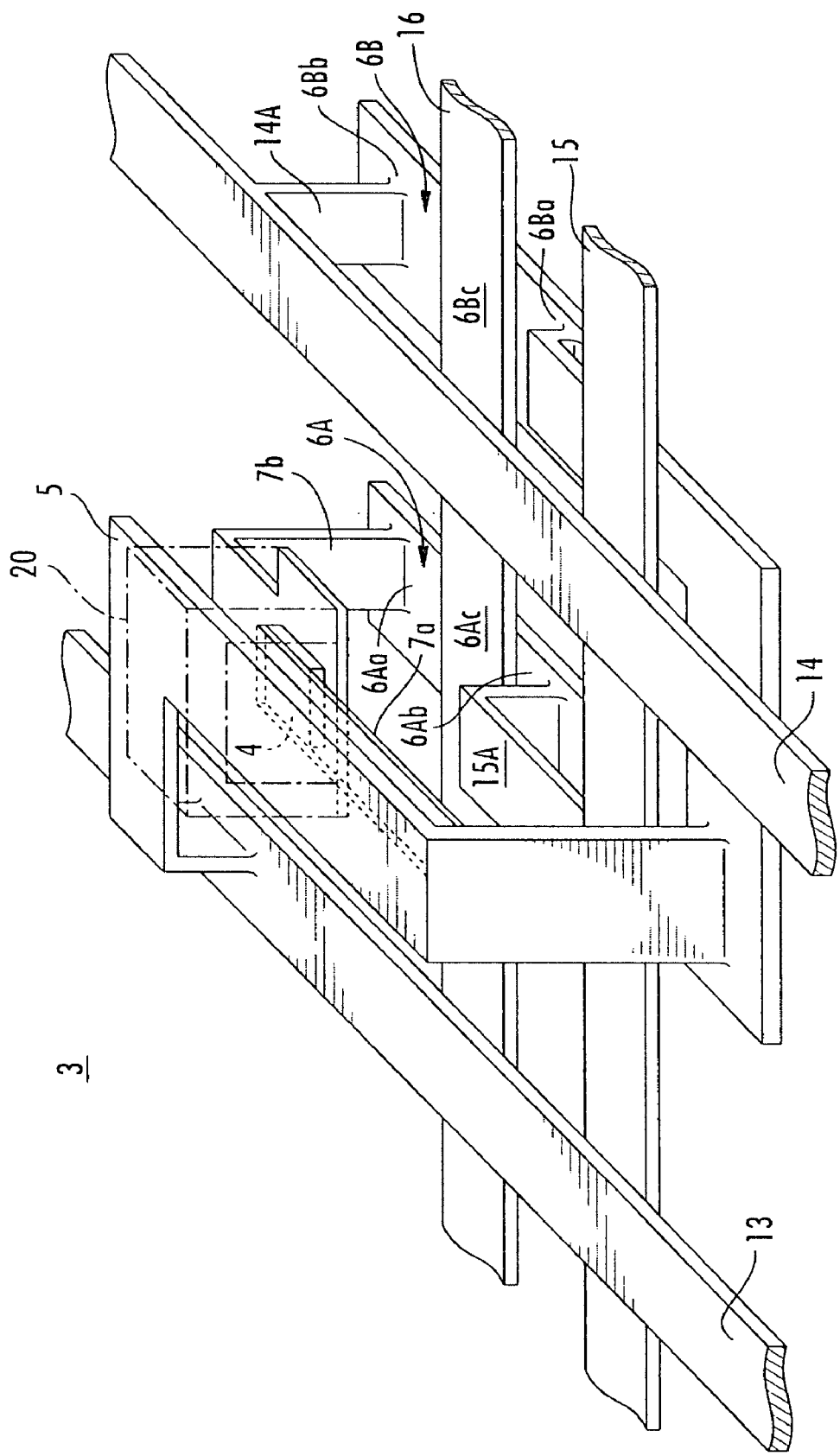
FIG. 3 is an enlarged perspective view three-dimensionally showing the internal structure of the magnetic storage device.

A detailed description will now be given of the specific structure of the storage areas 3 in the magnetic storage device 1. FIG. 3 is a perspective view three-dimensionally showing the wiring state and the like of the storage area 3. The storage area 3 broadly includes, from the lower side thereof, a semiconductor layer, a wiring layer, and a magnetic material layer. The semiconductor layer includes a semiconductor substrate (not shown in particular), and semiconductor devices such as the read transistor 6A and the write transistor 6B are formed in the semiconductor layer while the mechanical strength of the overall storage area 3 is maintained. In the uppermost magnetic material layer, components made from a magnetic material, such as the TMR element 4 and the ferromagnetic yoke 20 for efficiently applying a magnetic field to the TMR element 4 are mainly formed. In the wiring layer located between the above layers the bit lines 13 and 14, the word lines 15 and 16, a part of the write line 5, the read line 7b, and the like are formed.

The read transistor 6A and the write transistor 6B in the semiconductor layer are formed so as to be surrounded by an insulating area. An insulating material such as $SiO_2$ is used as the material for the insulating area. An Si substrate, for example, is used as the semiconductor substrate for the transistors, and the semiconductor substrate may be doped with p-type or n-type impurities.

Figure 4:
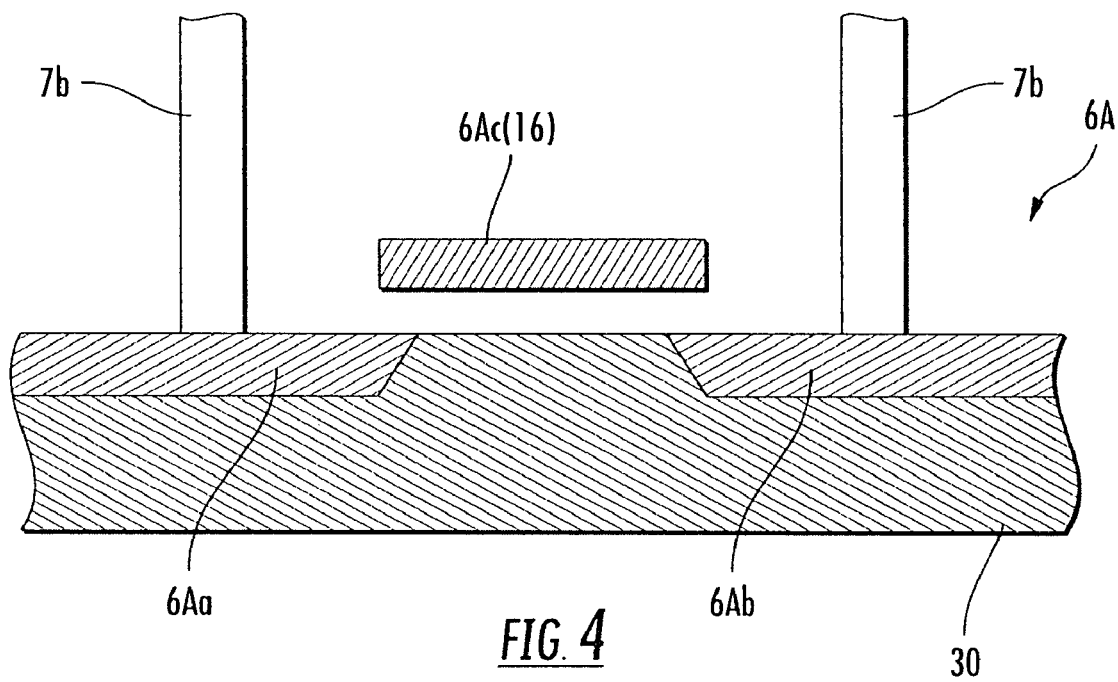
FIG. 4 is an enlarged sectional view showing the structure of a transistor in the storage area.

As shown in an enlarged view of FIG. 4, the read transistor 6A is composed of a drain region 6Aa, a source region 6Ab, a gate electrode 6Ac, and the like. The conduction type of the drain region 6Aa and the source region 6Ab is different from that of the semiconductor substrate 30. The semiconductor substrate 30 is thus interposed between the drain region 6Aa and the source region 6Ab, and the gate electrode 6Ac is arranged above the semiconductor substrate 30 with a predetermined space therebetween. The gate electrode 6Ac is composed of the word line 16. Thus, in this configuration, when a voltage is applied to the word line 16, the conduction between the drain region 6Aa and the source region 6Ab of the read transistor 6A is provided, and a read current supplied from the bit line 13 is allowed to pass through the read line 7a, the TMR element 4, and the read line 7b. It should be appreciated that the write transistor 6B has a substantially similar structure, and thus the description thereof will be omitted here.

Returning to FIG. 3, in the wiring layer, the insulating region occupies the entire region, excluding the wiring such as the bit lines 13 and 14, the word lines 15 and 16, and the read line 7b. An insulating material such as $SiO_2$ is used as the material for the insulating region, as in the insulating region of the semiconductor layer. W or Al may be used as the material for the wiring lines.

The write line 5 adjacent to the TMR element 4 extends in a direction within the array plane (a flat plane) of the storage areas 3 and has an L-shape bent within that flat plane. Furthermore, both end portions of the write line 5 are bent in a direction perpendicular to the flat plane to form vertical lines. The lower end of one of the vertical lines is connected to the bit line 13. The lower end of the other vertical line makes an ohmic junction with the drain region 6Ba of the write transistor 6B via a horizontal line. A drawing line 14A corresponding to each of the storage areas 3 is branched off from the bit line 14 in the vertical direction, and the lower end thereof makes an ohmic junction with the source region 6Bb of the write transistor 6B. Therefore, the write line 5 is arranged so as to bridge a pair of bit lines 13 and 14 with the write transistor 6B interposed therebetween.

The read line 7a extends in a direction within the flat plane. One end portion of the read line 7a is electrically connected to the TMR element 4, and the other end portion is connected to the write line 5. One end portion of the read line 7b is electrically connected to the TMR element 4, and the other end portion is bent in the vertical direction to form a vertical line. The lower end of the vertical line makes an ohmic junction with the source region 6Ab of the read transistor 6A. Furthermore, a drawing line 15A corresponding to each of the storage areas 3 is branched off from the word line 15 in the vertical direction, and the lower end thereof makes an ohmic junction with the drain region 6Aa of the read transistor 6A. Therefore, part of the write line 5, the read line 7a, the TMR element 4, the read line 7b, and the read transistor 6A are arranged in this order between the bit line 13 and the word line 16, whereby the bit line 13 and the word line 16 are electrically connected to each other.

It should be appreciated that part of the word line 16 extending in the row direction serves also as the gate electrodes 6Ac and 6Bc of the transistors 6A and 6B, respectively.

This means that the word line 16 is electrically connected to the gate electrodes 6Ac and 6Bc of the transistors 6A and 6B, respectively.

Figure 5:
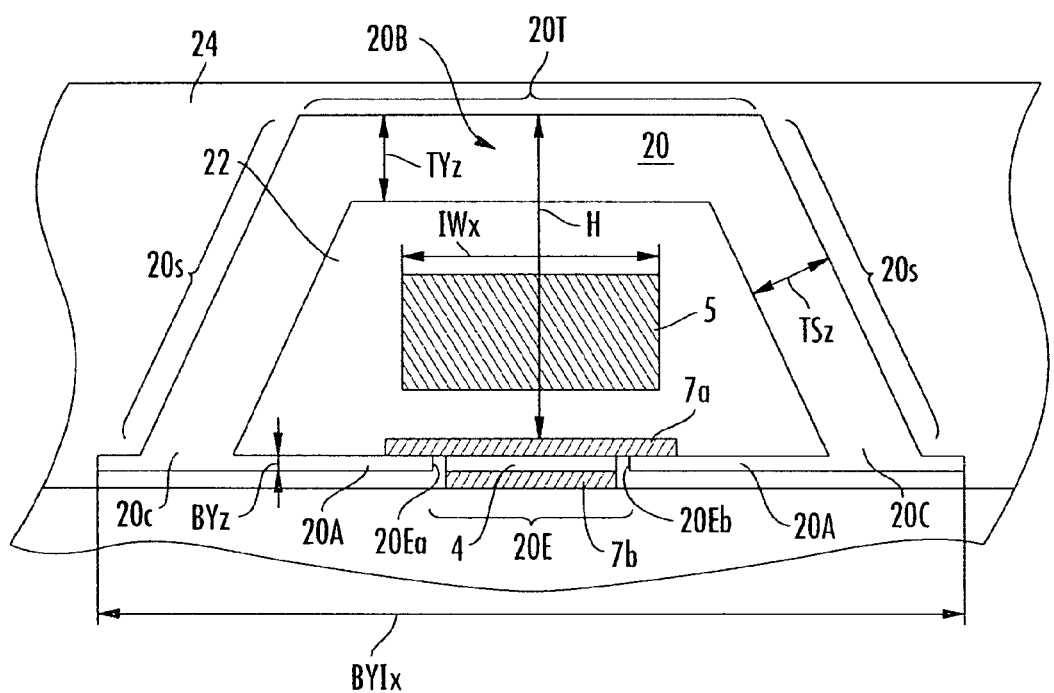
FIG. 5 is an enlarged sectional view showing the structure of a ferromagnetic yoke in the storage area.

A description will now be given of the magnetic material layer with reference to FIG. 5 and the like. The magnetic material layer includes the TMR element 4, the ferromagnetic yoke 20, part of the write line 5, the read line 7a, and the like. It should be noted that, in the magnetic material layer the region other than the components to be described below and other wiring is occupied by an insulating region 24.

Figure 6:
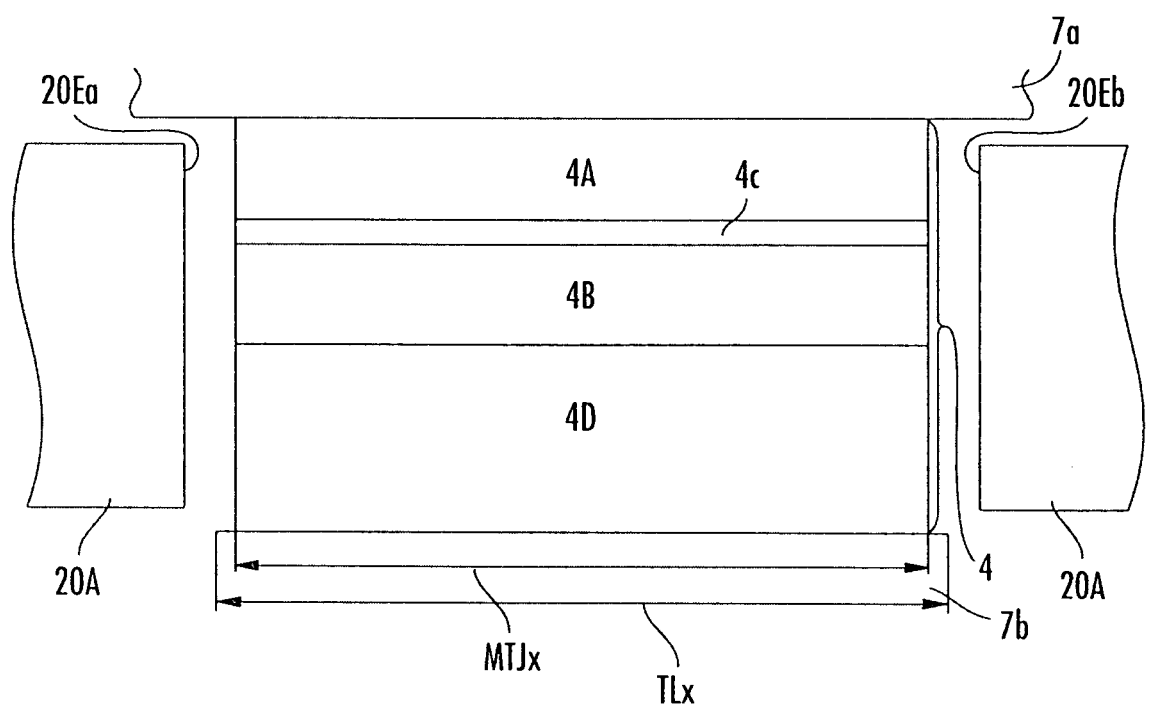
FIG. 6 is an enlarged side view showing the stacking structure of the TMR element arranged in the storage area.

As shown enlarged in FIG. 6, the TMR element 4 includes: a first magnetic layer 4A (being a free layer or a magnetic sensing layer) in which the direction of magnetization is changed by an external magnetic field; a second magnetic layer 4B (being a pinned layer) in which the direction of magnetization is fixed; a non-magnetic insulating layer 4C (being an insulating layer) which is interposed between the first magnetic layer 4A and the second magnetic layer 4B; and an antiferromagnetic layer 4D which fixes (pins) the direction of magnetization of the second magnetic layer. The TMR element 4 is configured such that when the direction of magnetization of the first magnetic layer 4A changes by an external magnetic field, the resistance value between the first magnetic layer 4A and the second magnetic layer 4B changes. Binary data can be recorded according to the difference in resistance value. As the material for the first magnetic layer 4A, a ferromagnetic material such as Co, CoFe, CoFeB, NiFe, NiFeCo, or CoPt may be used.

In the second magnetic layer 4B, the direction of magnetization is fixed by the antiferromagnetic layer 4D. Specifically, the direction of magnetization of the second magnetic layer 4B is stabilized in a state in which the magnetization is oriented in one direction due to exchange coupling at the joint surface between the antiferromagnetic layer 4D and the second magnetic layer 4B. The second magnetic layer 4B is arranged such that the easy magnetization axis direction thereof is aligned along that direction of the first magnetic layer 4A. As the material for the second magnetic layer 4B, a ferromagnetic material such as Co, CoFe, CoFeB, NiFe, NiFeCo, or CoPt may be used. Furthermore, as the material for the antiferromagnetic layer 4D, IrMn, PtMn, FeMn, PtPdMn, NiO, or any combination thereof may be used.

The non-magnetic insulating layer 4C is composed of a non-magnetic and insulative material and is interposed between the first magnetic layer 4A and the second magnetic layer 4B, so as to produce a tunneling magneto-resistive (TMR) effect. Specifically, the non-magnetic insulating layer 4C has characteristics that the electrical resistance value thereof is different depending on the relationship between the magnetization directions of the first magnetic layer 4A and the second magnetic layer 4B (i.e., whether the magnetization directions thereof are in parallel or antiparallel). As the material for the non-magnetic insulating layer 4C, an oxide or nitride of a metal such as Al, Zn, Mg, or Ti may be preferably used.

The first magnetic layer 4A is electrically connected to the read line 7a. Furthermore, the antiferromagnetic layer 4D is electrically connected to the read line 7b. This configuration allows a read current to pass from the read line 7a to the read line 7b via the TMR element 4, and thus a change in the electrical resistance of the TMR element 4 can be detected. The ferromagnetic yoke 20 is arranged so as to cover a region of the write line 5 adjacent to the TMR element 4. Furthermore, the first magnetic layer 4A of the TMR element 4 is arranged such that the easy magnetization axis direction thereof is aligned along a direction intersecting the longitudinal direction of the write line 5 (i.e. a direction intersecting the direction of a write current).

Although not shown in a figure, the TMR element 4 may be configured to have the first magnetic layer (the free layer or the magnetic sensing layer), the non-magnetic insulating layer (the insulating layer), the second magnetic layer, a non-magnetic metal layer, a third magnetic layer, and the antiferromagnetic layer in this order. In this case, the antiferromagnetic layer fixes (pins) the direction of magnetization of the third magnetic layer, and the thickness of the second magnetic layer is adjusted to a suitable value, whereby the direction of magnetization of the second magnetic layer is oriented in antiparallel to the direction of magnetization of the third magnetic layer. This can be achieved by utilizing exchange interaction generated between the second magnetic layer and the third magnetic layer.

Returning to FIG. 5, the ferromagnetic yoke 20 includes: an element side yoke 20A which is arranged near the extending write line 5 on the TMR element 4 side; and a counter side yoke 20B which is arranged near the write line 5 on the side opposite to the TMR element 4 side. A pair of yoke connecting portions 20C is provided for connecting each of the end portions of the element-side yoke 20A to the corresponding one of the end portions of the counter-side yoke 20B to form a substantially annular shape. Therefore, the element-side yoke 20A is in the vicinity of the TMR element 4, and the counter-side yoke 20B is away from the TMR element 4 with reference to the TMR element 4. In this instance, the ferromagnetic yoke 20 itself covers part of the outer periphery of the write line 5. The counter-side yoke 20B is configured to include: a top region 20T located above the write line 5; and inclined regions 20S each positioned on one of the end sides of the top region 20T, i.e., in the vicinity of one of the yoke connecting portions 20C. It should be appreciated that the ferromagnetic yoke 20 also has the function of protecting the TMR element 4 from an external magnetic field which would adversely affect the TMR element 4.

The element-side yoke 20A has a gap 20E formed at the midpoint in the annular direction, and the TMR element 4 is interposed in the gap 20E. Therefore, when viewed from the axial direction, the ferromagnetic yoke 20 has a substantially C-shape having open ends 20Ea and 20Eb in part of the circumferential length thereof. Each of the open ends 20Ea and 20Eb serves as a protruding end of the element-side yoke 20A and is arranged in the vicinity of a side surface of the TMR element 4.

The inclined regions 20S and the yoke connecting portions 20C guide a magnetic field generated in the top region 20T to the element-side yoke 20A (i.e., toward the TMR element 4). Therefore, the internal magnetic field generated in the top region 20T is inverted through the inclined regions 20S and the yoke connecting portions 20C, and thus the direction of the internal magnetic field is inverted in the element-side yoke 20A. Further, the counter-side yoke 20B is formed so that the inclined regions 20S are inclined outwardly toward the element-side yoke 20A. More specifically, the angle P between the top region 20T and the inclined regions 20S (see FIG. 8) is set to an obtuse angle, and the connection angle between the element-side yoke 20A and the inclined regions 20S at the yoke connecting portions 20C is set to an acute angle. In addition to this, the thickness of the inclined regions 20S is made greater than that of the element-side yoke 20A.

Figure 7:
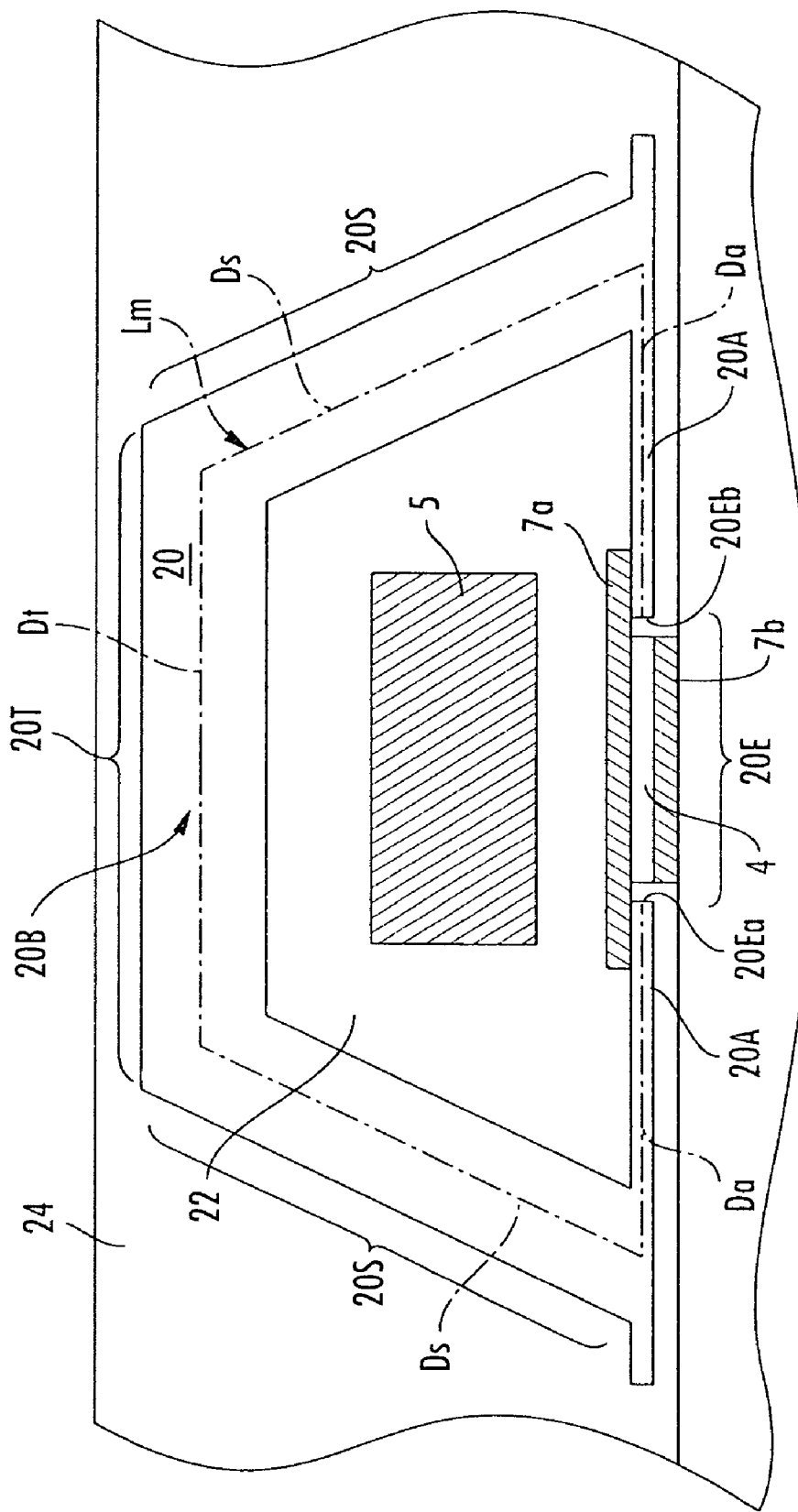
FIG. 7 is a side view showing the magnetic path length of the ferromagnetic yoke in the storage area.

As shown in FIG. 7, a circumferential magnetic path is formed in the ferromagnetic yoke 20. In the present embodiment, the ferromagnetic yoke 20 is configured such that the length Lm of the magnetic path (the magnetic path length) is equal to or less than 6 µm. The magnetic path length Lm is a length obtained by circumferentially tracing the widthwise central position of the ferromagnetic yoke 20 when the ferromagnetic yoke 20 is viewed from the lengthwise direction of the write line 5. Specifically, the magnetic path length Lm is the sum of the length of centerlines Ds of the inclined regions 20S, the length of a centerline Dt of the top region 20T, and the length of a centerline Da of the element-side yoke 20A.

Moreover, in the magnetic storage device 1, the permeability μ of the ferromagnetic yoke 20 is made to be equal to or more than 50, and preferably equal to or more than 300. In this manner, the magnetic resistance of the ferromagnetic yoke 20 can be reduced.

In order to make the magnetic path length Lm to 6 μm or less, the dimensions of the ferromagnetic yoke 20 are set as follows. Referring to FIG. 5, a maximum height H of the counter-side yoke 20B with reference to the TMR element 4 is set to, for example, 300 nm or less. The width BY1x of the ferromagnetic yoke 20 depends on the width IWx of the write line 5. Specifically, the width BY1x is set to satisfy the relationship: BY1x=IWx+700 nm. In this instance, since the width IWx of the write line 5 is set to 0.2 μm to 0.8 μm, BY1x is 900 nm to 1500 nm. Further, although not particularly shown in the figure, the depth BYy of the ferromagnetic yoke 20 (being the size in the lengthwise direction of the line) is set to 0.45 μm to 0.8 μm. Moreover, as shown in FIG. 6, the width TLx of the read line 7b is set within the range of, for example, 500 nm to 1400 nm, and the width MTJx of the TMR element 4 is set to 0.2 μm to 0.8 μm. Although not shown in the figure in particular, the depth MTJy of the TMR element 4 is set to 0.2 μm to 1.6 μm. In this manner, the magnetic path length Lm of the ferromagnetic yoke 20 can be set within the range of 1 to 6 μm.

It should be noted that the thickness TYz of the top region 20T of the counter-side yoke 20B is made larger than the thickness BYz of the element-side yoke 20A. For example, the thickness TYz is set to 50 nm or more. The upper limit of the thickness TYz is not particularly limited by the relationship with the magnetic resistance. The thickness BYz of the element-side yoke 20A which is thinner than the counter-side yoke 20B is set to 10 nm or more. The upper limit of the thickness BYz is not particularly limited by the relationship with the magnetic resistance. Furthermore, the thickness TSz of the inclined regions 20S is set such that the counter-side yoke 20B and the element-side yoke 20A are as continuous in terms of magnetic resistance as possible. By increasing the thickness of the ferromagnetic yoke 20, the function as a yoke can be improved.

Moreover, in the present embodiment, the gap width between each of the open ends 20Ea and 20Eb of the ferromagnetic yoke 20 and the TMR element 4 contained in the gap 20E defined by the open ends 20Ea and 20Eb is set to 30 nm or less. The gap width is preferably 10 nm or less, most preferably zero. In this manner, the current consumption can be reduced.

When the ferromagnetic yoke 20 is manufactured, it is preferable that the inclined regions 20S and the top region 20T be integrally deposited in a series of processes. In this manner, the manufacturing cost can be reduced. For example, a metal containing at least one of Ni, Fe, and Co is preferred as the ferromagnetic material constituting the ferromagnetic yoke 20.

A description will now be given of a write operation for writing information onto the TMR element 4 in the magnetic storage device 1 of the present embodiment.

Figure 8:
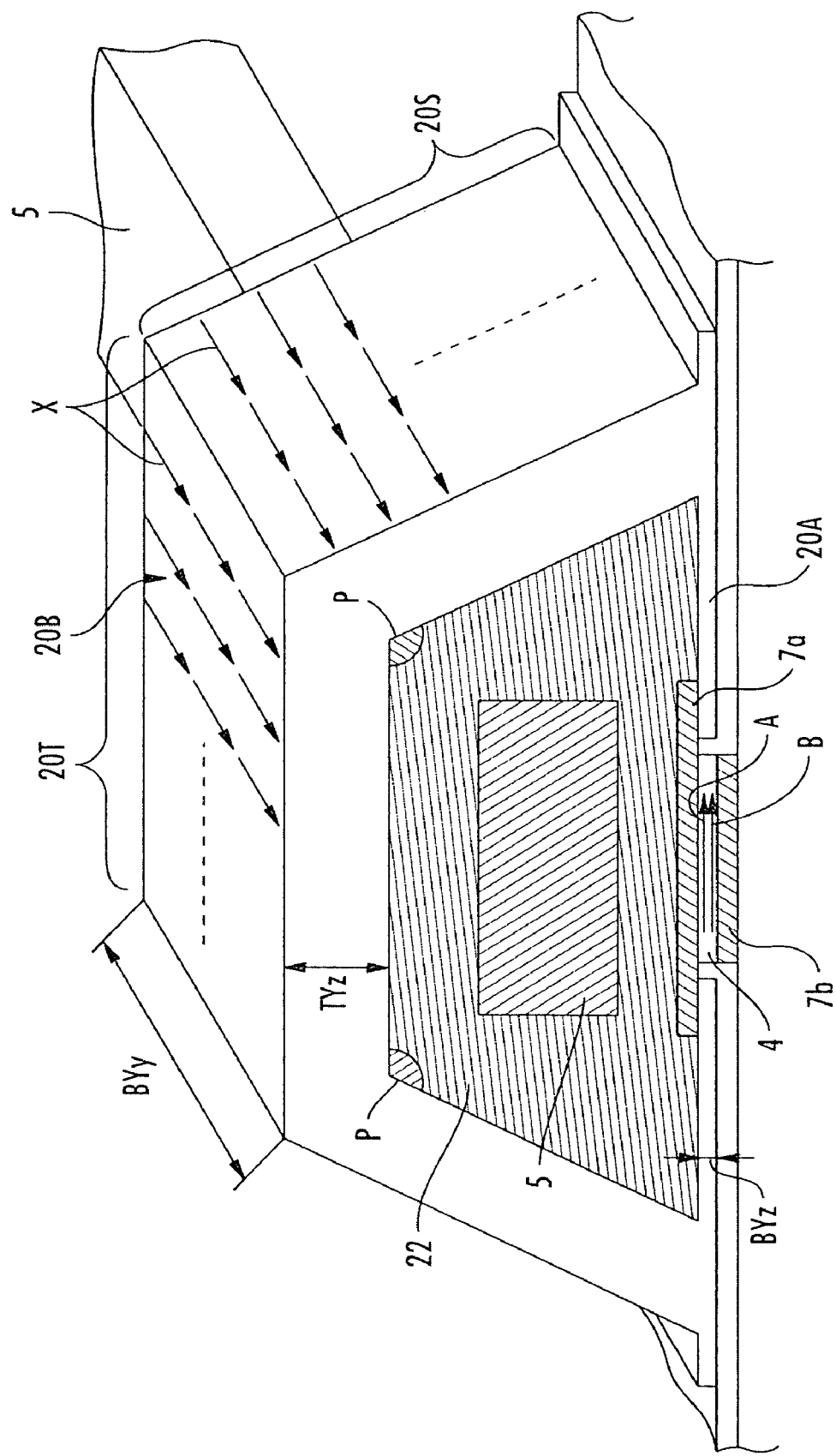
FIG. 8 is a partially sectional perspective view schematically showing a magnetization state of the ferromagnetic yoke in the storage area.

In the state shown in FIG. 8, no magnetic field is generated by the write line 5 when a current is not applied thereto. Preferably, the magnetization state X of the ferromagnetic yoke 20 is a single magnetic domain state with the magnetization direction of the ferromagnetic yoke 20 substantially coincident with the extending direction of the write line 5. If the magnetization state X is in a state wherein a plurality of magnetic domains are oriented in different directions, it is desirable that an antiferromagnetic layer be formed above the ferromagnetic yoke 20 to force the single magnetic domain state to be formed. In this instance, it should be noted that the magnetization direction B of the second magnetic layer 4B and the magnetization direction A of the first magnetic layer 4A coincide with each other in the TMR element 4. In the present embodiment, when the magnetization directions A and B coincide with each other, the written value is defined as "0" in binary data.

Figure 9:
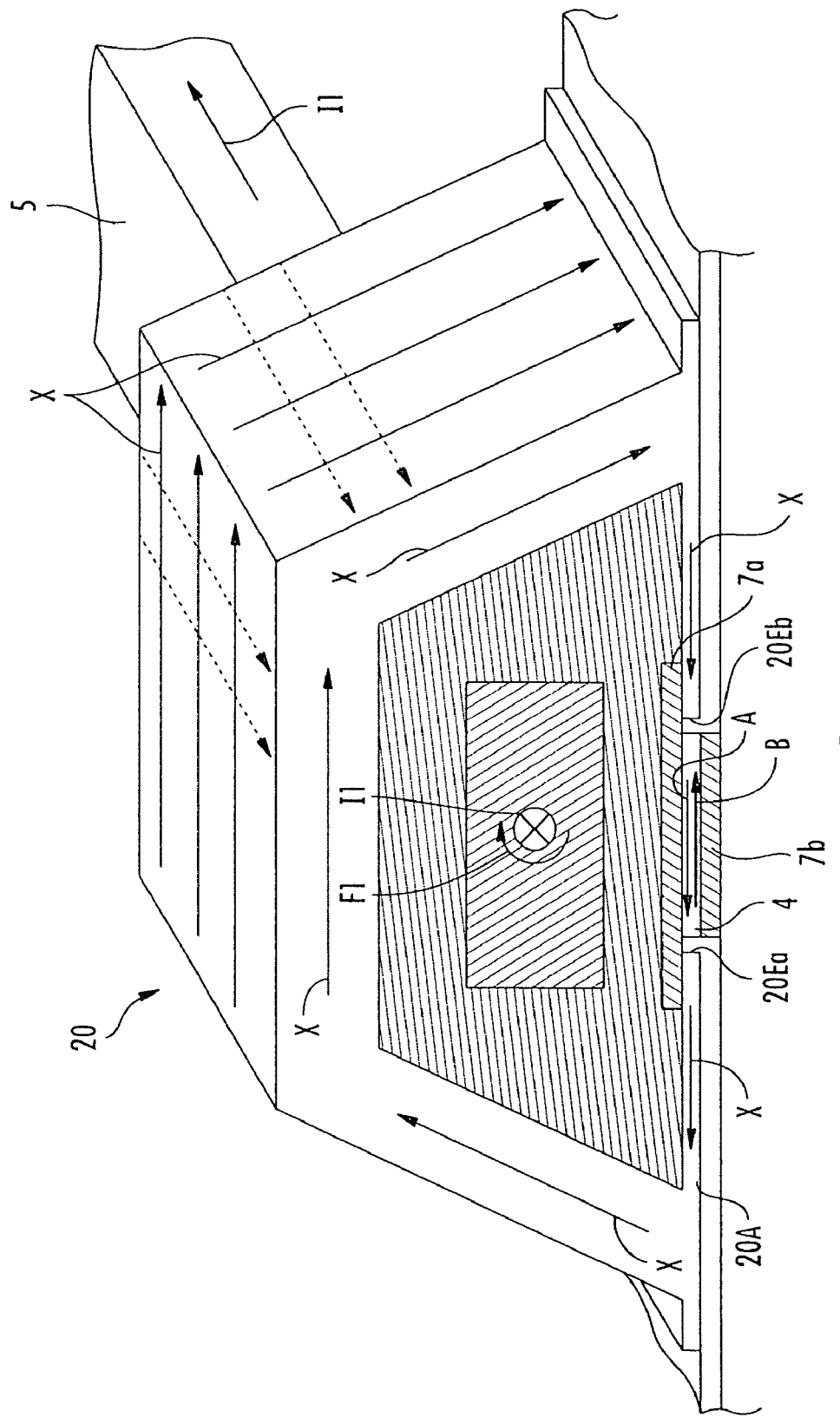
FIG. 9 is a partially sectional perspective view schematically showing a magnetization state of the ferromagnetic yoke in the storage area.

As shown in FIG. 9, when a write current I1 passes through the write line 5, a circumferential magnetic field F1 is generated around the write line 5. The ferromagnetic yoke 20 provided around the write line 5 is magnetized in the direction of the magnetization state X by the magnetic field F1, and a magnetic field is generated from the ends 20Ea and 20Eb of the element-side yoke 20A. This magnetic field is superposed on the magnetic field F1 to form a strong synthetic magnetic field, which is guided to the TMR element 4.

Therefore, the strong synthetic magnetic field of the magnetic field F1 generated from the write line 5 and the magnetic field induced by the magnetization state X generated in the ferromagnetic yoke 20 is concentrated in the element-side yoke 20A and acts on the first magnetic layer 4A in the TMR element 4 to invert the magnetization direction A thereof. In this state, when the current I1 of the write line 5 is interrupted, the magnetization direction A of the TMR element 4 is maintained in a reversed state as shown in FIG. 9. Since the state in which the magnetization direction A is opposite to the magnetization direction B is maintained, the written value is "1" in binary data.

Figure 10:
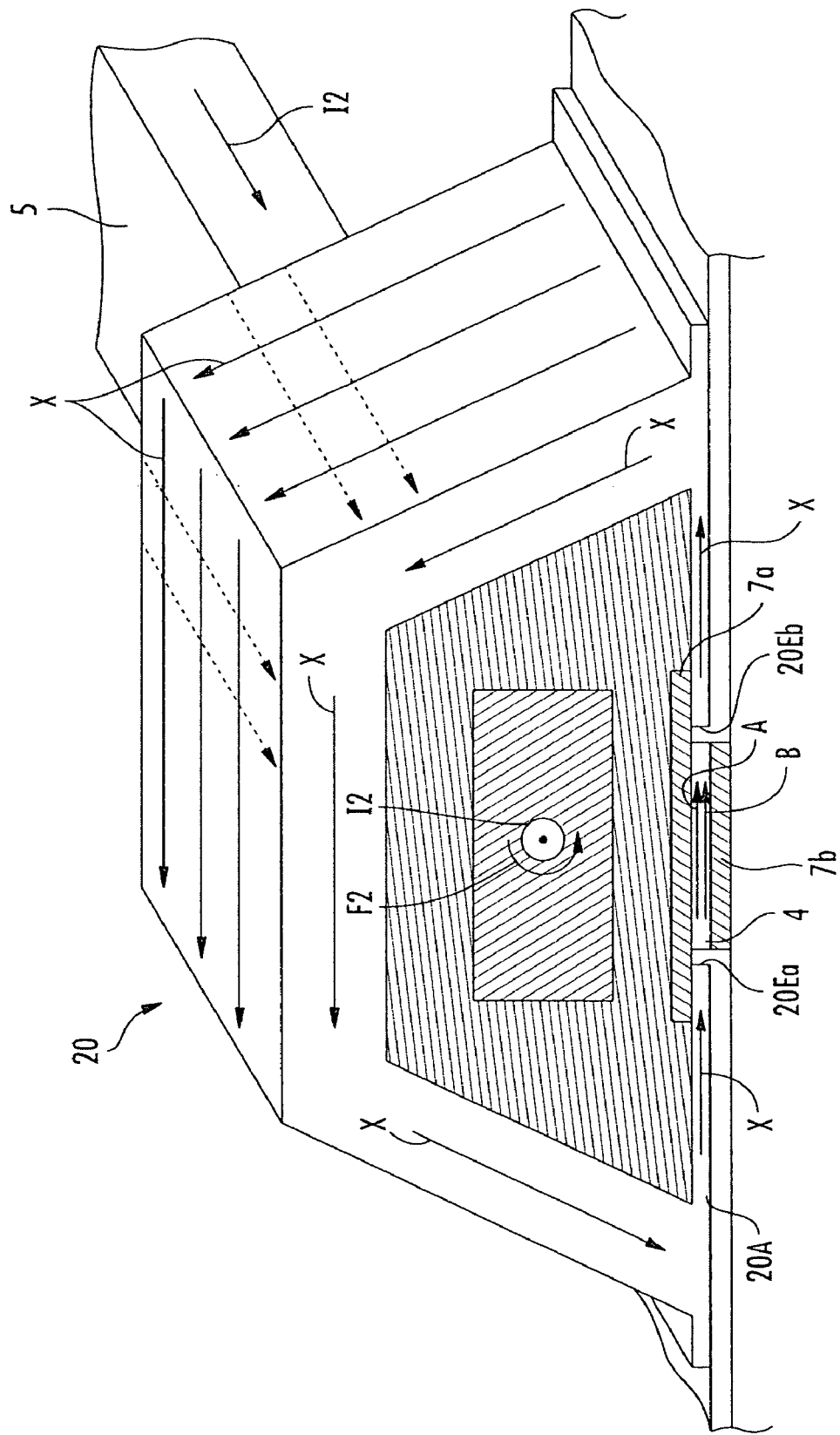
FIG. 10 is a partially sectional perspective view schematically showing a magnetization state of the ferromagnetic yoke in the storage area.

As shown in FIG. 10, when a write current I2 flowing in the direction opposite to the direction of the current I1 passes through the write line 5, a circumferential magnetic field F2 occurs around the write line 5. Consequently, the magnetic field F2 induces a change in the magnetization state X of the ferromagnetic yoke 20 provided around the write line 5. Specifically, the direction of the magnetization state X is rotated by 90° and is coincident with the direction of the magnetic field F2.

Therefore, a strong synthetic magnetic field of the magnetic field F2 generated from the write line 5 and the magnetic field induced by the magnetization state X generated in the ferromagnetic yoke 20 is concentrated in the element-side yoke 20A and acts on the first magnetic layer 4A in the TMR element 4 to invert the magnetization direction A thereof. Thus, the magnetization direction A of the TMR element 4 again coincides with the magnetization direction B of the second magnetic layer 4B. Since the magnetization directions A and B in the TMR element 4 are the same, "0" in binary data is again written.

When the binary date written in the TMR element 4 is read, a read current is applied between the read lines 7a and 7b, and the change in the potential difference between the lines is detected. Consequently, the resistance of the TMR element 4 is determined, and then a determination is made as to which of "0" and "1" in binary data is recorded (i.e., whether the magnetization direction A of the first magnetic layer 4A is in parallel or antiparallel with the magnetization direction of the second magnetic layer 4B). For example, when the magnetization direction A of the first magnetic layer 4A coincides with the magnetization direction B of the second magnetic layer 4B, the resistance value between the first magnetic layer 4A and the second magnetic layer 4B is reduced to a relatively small value due to the tunneling magneto-resistive (TMR) effect in the non-magnetic insulating layer 4C. Conversely, if the magnetization direction A is opposite to the magnetization direction B, the resistance value between the first magnetic layer 4A and the second magnetic layer 4B is increased to a relatively large value due to the tunneling magneto-resistive effect.

In the magnetic storage device 1 of the present embodiment, since the magnetic path length Lm of the ferromagnetic yoke 20 is set to 6 μm or less, the write current can be significantly reduced. The reason for this may be that a magnetic field can be applied to the TMR element 4 more efficiently as the size of the ferromagnetic yoke 20 decreases. Furthermore, in the magnetic storage device 1 of the present embodiment, the write current Iw can be reduced. Therefore, the write transistor 6B for controlling the write current Iw can be made more compact, and thus the degree of integration of the magnetic storage device 1 can be increased. It should be noted that, when the magnetic path length Lm is greater than 6 μm, the write current increases steeply, and fluctuations in current value become large.

Therefore, in the magnetic storage device 1, when the magnetic path length Lm is 6 μm or less, it is suggested that the degree of integration of the magnetic storage device 1 can be increased as the size of the ferromagnetic yoke 20 is reduced, i.e., there is a possibility that the so-called scaling rule holds.

EXAMPLES

Figure 11:
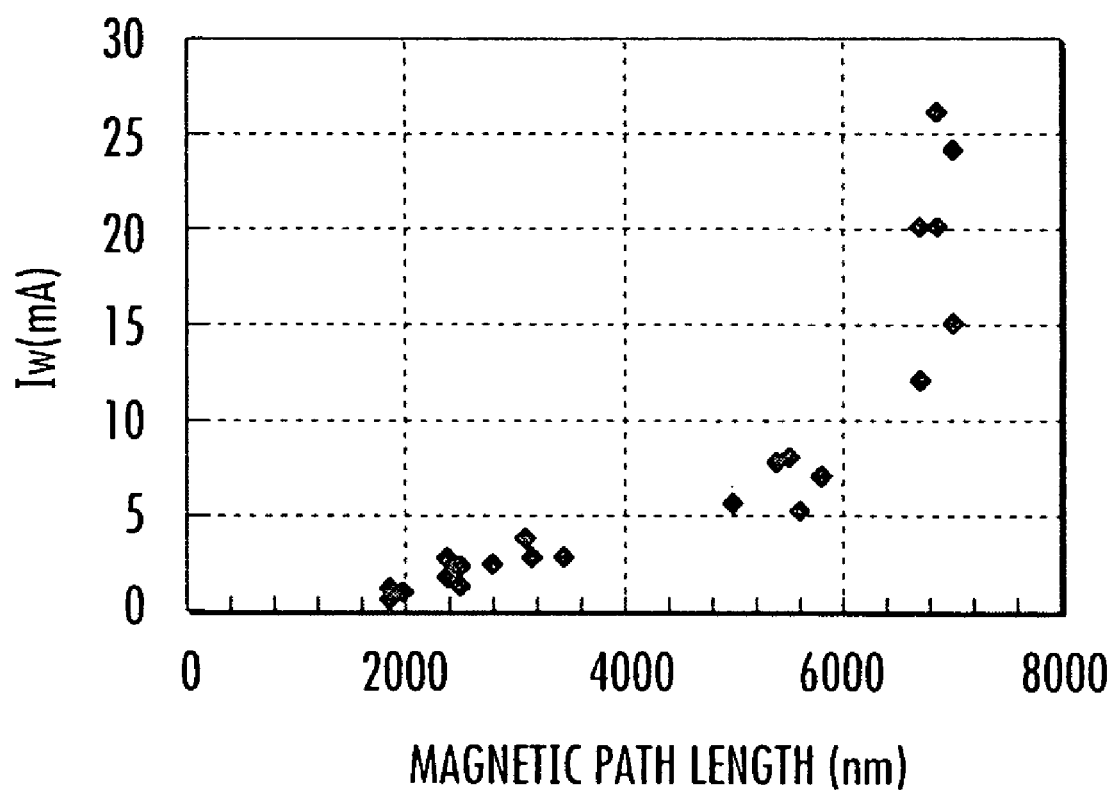
FIG. 11 is a graph showing the analysis results of the relationship between the magnetic path length and a write current in the magnetic storage device.

A plurality of samples of the magnetic storage device 1 was manufactured such that the samples had different magnetic path lengths Lm, and the write current Iw was measured. The results are shown in FIG. 11. As is clear from the results, the write current Iw became 10 mA or less when the magnetic path length was 6 μm or less. When the magnetic path length Lm was 4 μm or less, the write current Iw could be reduced to 5 mA or less. Meanwhile, when the magnetic path length Lm was greater than 6 μm, the value of the write current Iw increased steeply. Therefore, the write current Iw can be reduced by reducing the magnetic path length Lm of the ferromagnetic yoke 20 to 6 μm or less, and preferably 4 μm or less.

Figure 12:
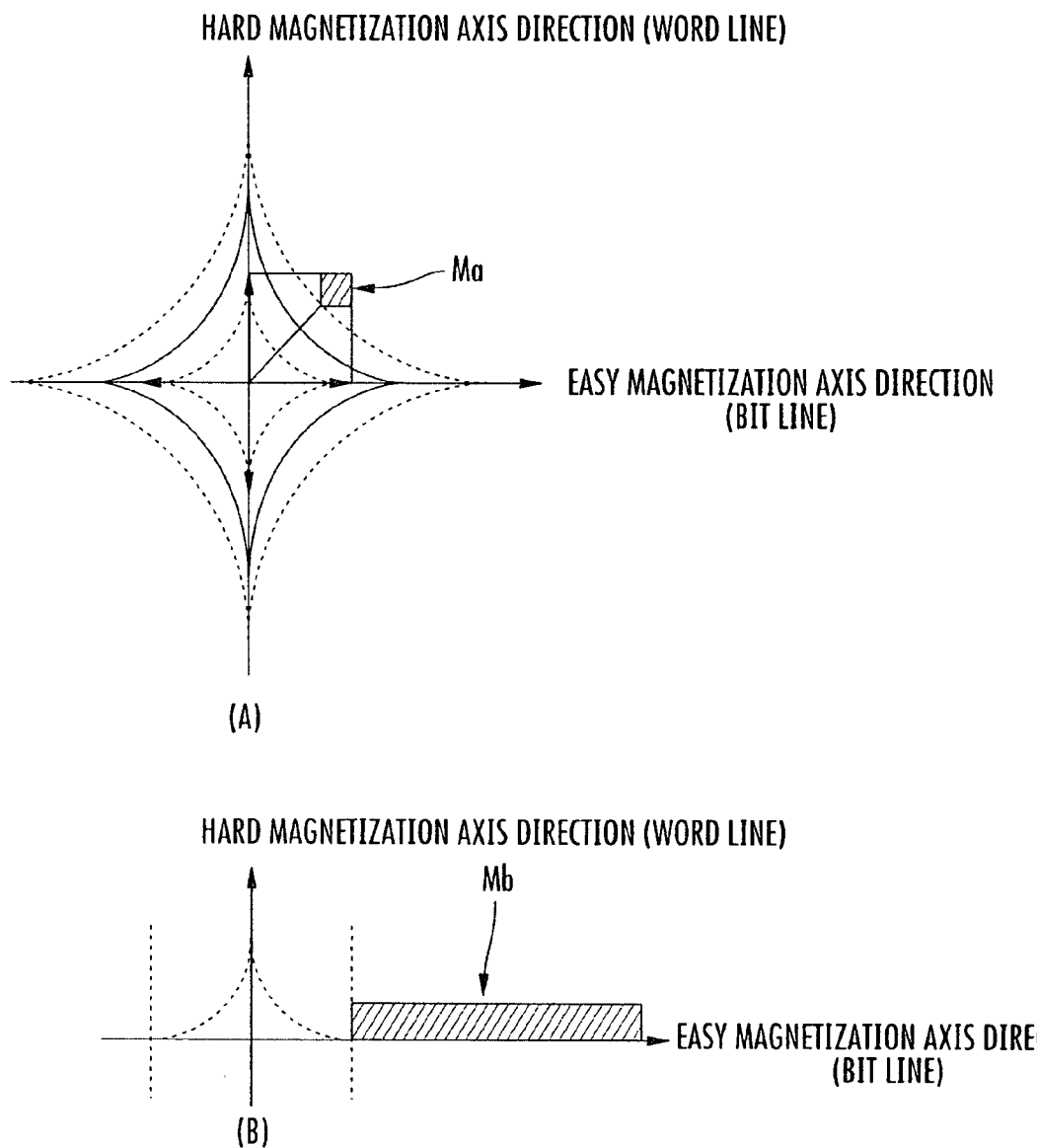
FIG. 12 is a set of graphs for comparing the operation margin of the magnetic storage device with that of a conventional magnetic storage device.

Moreover, by reducing the magnetic path length Lm of the ferromagnetic yoke 20 to 4 μm or less, the write current Iw can be reduced to 5 mA or less. Therefore, the size of the write transistor 6B for controlling the current in the write line 5 can be significantly reduced, and thus the write transistor 6B can be provided in each of the storage areas 3. For example, FIG. 12(A) schematically shows a state of a write margin of a conventional cross-point type magnetic storage device. In the conventional magnetic storage device, it was necessary that the magnetization direction of a TMR element be inverted using a combination of the magnetic field of a bit line and the magnetic field of a word line, and that a reading operation be carried out utilizing these lines. Therefore, an operation margin region Ma of the TMR element lay outside the maximum value (see the dotted line) of the variation in the currents of the bit line and the word line, and thus the operation margin region Ma of the TMR element had to be set very small. Meanwhile, in the magnetic storage device 1 as described in the present embodiment, the write operation is carried out by allowing a current to pass through the write line 5 via the bit line 13 by utilizing the write transistor 6B. Therefore, as shown in FIG. 12(B), it is sufficient that the magnetization direction of the TMR element 4 be inverted in a region in which the current in the bit lines 13 is equal to or greater than the maximum value (see the dotted line) of the variation in the current of the bit lines 13. Therefore, an operation margin region Mb of the TMR element 4 can be set very large.

In the present embodiment, any method can be used as a method for forming the gap 20E in the element-side yoke 20A. For example, the gap 20E may be formed by forming a continuous element-side yoke 20A and thereafter subjecting the element-side yoke 20A to cutting processing. Alternatively, the element-side yoke 20A and the gap 20E may be formed simultaneously by individually forming the element-side yokes 20A.

Figure 13:
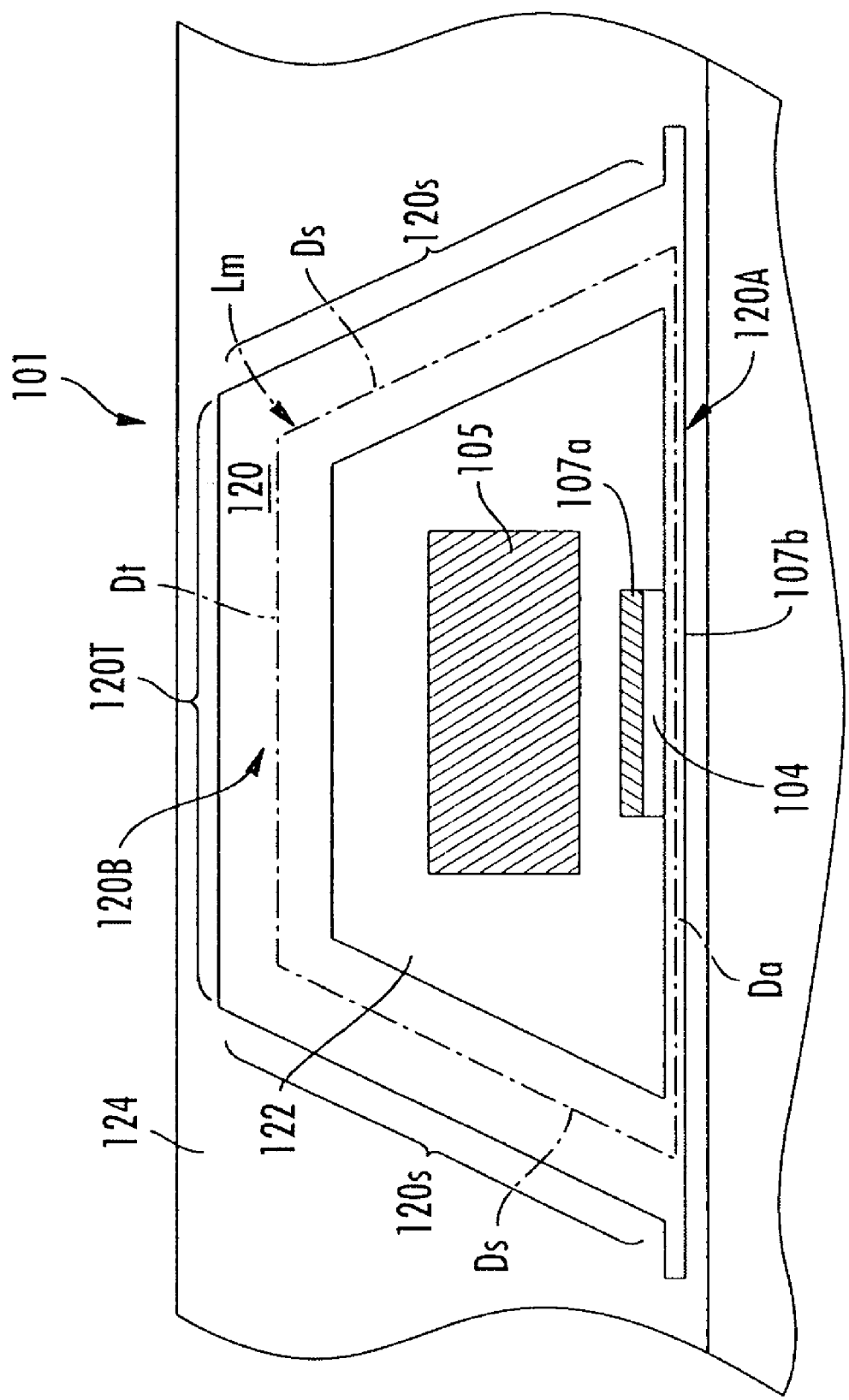
FIG. 13 is a side view showing another example of the magnetic path length of the ferromagnetic yoke in the storage area.

Furthermore, in the present embodiment, the description has been given only of the case in which the gap 20E is formed in the ferromagnetic yoke 20 and the TMR element 4 is arranged in the gap 20E, but the present invention is not limited thereto. For example, as in a magnetic storage device 101 shown in FIG. 13, a ferromagnetic yoke 120 is formed into a continuous annular shape. In this case, the magnetic path of the ferromagnetic yoke 120 is also annular. In this magnetic storage device 101, a first magnetic layer (being a free layer or a magnetic sensing layer) of a TMR element 104 is arranged so as to abut on an element-side yoke 120A, and the magnetic field of the TMR element 104 is inverted by means of ferromagnetic coupling with the element-side yoke 120A. Since the other configurations are the same as those of the magnetic storage device 1 having been described using FIG. 7 and the like, a description thereof will be omitted while using the same last two digits in the drawings.

Moreover, the present invention is not limited to these embodiments, and various modifications can be made to the embodiments. In the above embodiments, the TMR element is employed as a magneto-resistive element. However, for example, a GMR element may be used which utilizes the giant magneto-resistive (GMR) effect of CPP (Current Perpendicular to Plane) type. The GMR effect refers to a phenomenon in which the resistance value of two ferromagnetic layers with a nonmagnetic layer interposed therebetween in a direction perpendicular to the lamination direction is changed depending on the angle formed between the magnetization directions of the two ferromagnetic layers. More specifically, in a GMR element, the resistance value of the ferromagnetic layers is minimized when the magnetization directions of the two ferromagnetic layers are in parallel with each other and is maximized when the magnetization directions of the two ferromagnetic layers are in antiparallel with each other. Meanwhile, TMR elements and GMR elements both may be classified into: a pseudo spin valve type in which writing and reading are carried out by utilizing the difference in coercivity between two ferromagnetic layers; and a spin valve type in which the direction of magnetization of one of ferromagnetic layers is fixed by means of exchange coupling with an antiferromagnetic layer. Furthermore, reading of data in GMR elements is carried out by detecting a change in the resistance value of their ferromagnetic layers in a direction perpendicular to the lamination direction. Also, writing of data in GMR elements is carried out by inverting the direction of magnetization of one of the ferromagnetic layers by means of the magnetic field generated by a write current.

In the above embodiments, the transistors (being transistors used for both reading and writing) are used as the switching means for controlling the write current and the read current. However, as the switching means, various means which have the function of interrupting and passing a current in accordance with need may be used.

It is also understood that the magnetic storage device of the present invention is not limited to the embodiments described above, and various modifications may be made without departing from the gist of the present invention.

The present invention can be widely utilized in the fields of recording and retaining various types of information by means of magneto-resistive elements.

The entire disclosure of Japanese Patent Application No. 2006-203456 filed on Jul. 26, 2006 including specification, claims, drawings, and summary are incorporated herein by reference in its entirety.

What is claimed is:

1. A magnetic storage device, comprising:
a line;
a yoke circumferentially surrounding part of the line in a longitudinal direction; and
a magneto-resistive element arranged in the vicinity of the line, to which information can be written by utilizing a magnetic field generated by the line, wherein
a length of a magnetic path of the yoke is equal to or less than 6 μm,
wherein a length of the yoke in a longitudinal direction of the line is shorter than a length of the line in a longitudinal direction;
a gap is formed in part of the yoke in a circumferential direction; and the magneto-resistive element is arranged in or between the gap.

2. The magnetic storage device according to claim 1, wherein the length of the magnetic path of the yoke is equal to or less than 4 μm.

3. The magnetic storage device according to claim 1, wherein a permeability of the yoke is equal to or greater than 300 H/m.

4. The magnetic storage device according to claim 1, a distance between each of end portions of the yoke forming the gap and the magneto-resistive element contained in the gap defined by the end portions of the yoke is equal to or less than 30 nm.

5. The magnetic storage device according to claim 1, wherein: a plurality of storage cells each including the line, the yoke, and the magneto-resistive element are arranged in an array; and each of the storage cells comprises write switching means for controlling electrical conduction of the line.

6. The magnetic storage device according to claim 1, wherein: a plurality of storage cells each including the line, the yoke, and the magneto-resistive element are arranged in an array; each of the storage cells comprises write switching means for controlling electrical conduction of the line; and each of the storage cells further comprises: a read line for allowing a current to pass though the magneto-resistive element; and read switching means for controlling electrical conduction of the read line.

7. The magnetic storage device according to claim 1, wherein: the length of the magnetic path of the yoke is equal to or less than 4 μm; and a permeability of the yoke is equal to or greater than 300 H/m.

8. The magnetic storage device according to claim 1, wherein: the length of the magnetic path of the yoke is equal to or less than 4 μm.

9. The magnetic storage device according to claim 1, wherein: a permeability of the yoke is equal to or greater than 300 H/m.

10. The magnetic storage device according to claim 1, wherein: the length of the magnetic path of the yoke is equal to or less than 4 μm; a permeability of the yoke is equal to or greater than 300 H/m; and a distance between each of end portions of the yoke forming the gap and the magneto-resistive element contained in the gap defined by the end portions of the yoke is equal to or less than 30 nm.

11. The magnetic storage device according to claim 1, wherein: the length of the magnetic path of the yoke is equal to or less than 4 μm; a plurality of storage cells each including the line, the yoke, and the magneto-resistive element are arranged in an array; and each of the storage cells comprises write switching means for controlling electrical conduction of the line.

12. The magnetic storage device according to claim 1, wherein: a permeability of the yoke is equal to or greater than 300 H/m; a plurality of storage cells each including the line, the yoke, and the magneto-resistive element are arranged in an array; and each of the storage cells comprises write switching means for controlling electrical conduction of the line.

13. The magnetic storage device according to claim 1, wherein: a plurality of storage cells each including the line, the yoke, and the magneto-resistive element are arranged in an array; and each of the storage cells comprises write switching means for controlling electrical conduction of the line.

14. The magnetic storage device according to claim 1, wherein: a distance between each of end portions of the yoke forming the gap and the magneto-resistive element contained in the gap defined by the end portions of the yoke is equal to or less than 30 nm; a plurality of storage cells each including the line, the yoke, and the magneto-resistive element are arranged in an array; and each of the storage cells comprises write switching means for controlling electrical conduction of the line.

15. The magnetic storage device according to claim 1, wherein: a distance between each of end portions of the yoke forming the gap and the magneto-resistive element contained in the gap defined by the end portions of the yoke is equal to or less than 30 nm; a plurality of storage cells each including the line, the yoke, and the magneto-resistive element are arranged in an array; each of the storage cells comprises write switching means for controlling electrical conduction of the line; and each of the storage cells further comprises: a read line for allowing a current to pass through the magneto-resistive element; and read switching means for controlling electrical conduction of the read line.

16. The magnetic storage device according to claim 1 wherein the yoke comprises: an element side yoke which is arranged near the line on the magneto-resistive element side; and a counter side yoke which is arranged near the line on the side opposite to the magneto-resistive element side; and the thickness of the counter-side yoke is made larger than the thickness of the element-side yoke; and
wherein a length of the element-side yoke and the counter-side yoke in a longitudinal direction of the line is shorter than a length of the line in a longitudinal direction.

17. The magnetic storage device according to claim 1, wherein the yoke comprises: an element side yoke which is arranged near the line on the magneto-resistive element side; and a counter side yoke which is arranged near the line on the side opposite the magneto-resistive element side: and the counter-side yoke further comprises: a top region located above the line; and an inclined regions each positioned on one of the end sides of the top region; and
wherein a length of the element-side yoke and the counter-side yoke in a longitudinal direction of the line is shorter than a length of the line in a longitudinal direction.

18. The magnetic storage device according to claim 1 wherein the yoke comprises: an element side yoke which is arranged near the line on the magneto-resistive element side; and a counter side yoke which is arranged near the line on the side opposite the magneto-resistive element side; and the counter-side yoke further comprises: a top region located above the line; and an inclined regions each positioned on one of the end sides of the top region; and the inclined regions and the top region are integrally deposited in a series of processes; and a length of the element-side yoke and the counter-side yoke in a longitudinal direction of the line is shorter than a length of the line in a longitudinal direction.

19. The magnetic storage device according to claim 16 wherein a length of the element side yoke is equal to a length of the counter side yoke in a longitudinal direction of the line.

20. The magnetic storage device according to claim 1 wherein a length of the yoke in a longitudinal direction of the line is from 0.45 to 0.8 μm.

* * * * *